United States Patent [19]
Ariyoshi

[11] Patent Number: 5,278,497
[45] Date of Patent: Jan. 11, 1994

[54] MAGNETIC SENSOR HAVING A MAGNET-SENSITIVE PLANE OF AN MR ELEMENT ARRANGED PERPENDICULAR TO BOTH A SUBSTRATE PLANE AND A MAGNET

[75] Inventor: Akihiro Ariyoshi, Hyogo, Japan

[73] Assignee: Mitsubishi Denki K.K., Tokyo, Japan

[21] Appl. No.: 893,002

[22] Filed: Jun. 3, 1992

[30] Foreign Application Priority Data

Jun. 18, 1991 [JP] Japan ................... 3-145976
Jun. 21, 1991 [JP] Japan ............... 3-046716[U]
Jun. 26, 1991 [JP] Japan ............... 3-048519[U]
Jul. 17, 1991 [JP] Japan ............... 3-055158[U]

[51] Int. Cl.⁵ .................... G01B 7/30; G01R 33/06
[52] U.S. Cl. .................. 324/207.21; 324/252
[58] Field of Search ............... 324/173, 174, 207.20, 324/207.21, 207.25, 251, 252; 307/309; 123/617

[56] References Cited

U.S. PATENT DOCUMENTS

| | | | |
|---|---|---|---|
| 4,392,375 | 7/1983 | Eguchi et al. | 324/207.21 X |
| 4,649,342 | 3/1987 | Nakamura | 324/252 X |
| 4,712,083 | 12/1987 | Heck et al. | 324/207.21 X |
| 4,769,600 | 9/1988 | Ito | 324/207.25 X |
| 4,875,008 | 10/1989 | Lorenzen | 324/207.25 X |
| 5,055,781 | 10/1991 | Sakakibara et al. | 324/207.25 X |

FOREIGN PATENT DOCUMENTS

63-1920 1/1988 Japan .
3-93705 9/1991 Japan .

Primary Examiner—Gerard R. Strecker
Attorney, Agent, or Firm—Sughrue, Mion, Zinn, Macpeak & Seas

[57] ABSTRACT

A magnetic sensor which includes a circuit substrate, a ferromagnetic resistant element (MR element) mounted on the substrate in such a manner that a magnet-sensitive plane of the MR element directs perpendicular to the substrate plane of the substrate, and an electro-magnetic wave shielding casing for covering the MR element having a positioning portion in which the MR element is fitted to obtain an accurate position thereof.

14 Claims, 8 Drawing Sheets

MAGNETIC SENSOR HAVING A MAGNET-SENSITIVE PLANE OF AN MR ELEMENT ARRANGED PERPENDICULAR TO BOTH A SUBSTRATE PLANE AND A MAGNET

BACKGROUND OF THE INVENTION

Field of the Invention

The present invention relates to a magnetic sensor for detecting change in magnetic flux crossing a magnet-sensing plane caused by rotating a magnet.

FIG. 1 is a cross-sectional view showing one conventional magnetic sensor. The conventional magnetic sensor is provided with a resin frame 1 of the sensor, a rotating shaft 2 mounted rotatably in the frame 1, an arm 3 fixed to one end of the rotating shaft 2, a magnet 4 secured onto the other end of the rotating shaft 2 by an adhesion 5, and a ferromagnetic resistive element hereinafter merely referred as MR element) 6. The MR element may be formed of a glass substrate, a magnet-sensitive plane 6a constituted by a magnetic resistive pattern of NiFe as the ferromagnetic resistive material and formed on the glass substrate, so that the MR element is molded by an insulating resin to form a rectangular solid having a terminal 6b at a side thereof for input/output signal.

The magnetic sensor is further provided with a ceramic substrate 7 performing as a circuit substrate on which a pattern of electric wiring is formed and various kinds of electronic devices are mounted although they are not shown in the figure. The MR element 6 is mounted on the substrate 7 in such a manner that the magnet-sensitive plane 6a is parallel to the surface of the substrate, and the terminal 6b is soldered to the electric wiring pattern. In this state, the ceramic substrate 7 is accommodated and held in the resin frame 1 in such a manner that the surface of the substrate 7 is perpendicular to the magnet 4, that is, the magnet-sensitive plane 6a is perpendicular to the magnet 4.

The substrate 7 on which the MR element 6 is mounted is housed in a copper casing 8 acting as an electromagnetic shielding casing. The MR element 6 is connected to an input/output terminal 9 through a penetrating capacitor 10 for taking an output signal of the MR element 6.

The operation of the conventional magnetic sensor will now be described hereinbelow.

When the arm 3 rotates in association with the opening/closing condition of a throttle valve (not shown) disposed in an intake conduit performing as an air-flow path of a vehicle, for example, the rotation of the arm 3 is transmitted to the magnet 4 through the rotating shaft 2, that is, the magnet 4 rotates in association with the arm 3.

By the rotation of the magnet 4, the magnetic flux generated from the magnet 4 and crossing the magnet-sensitive plane 6 varies and, as a result, the resistance value of the magnetic resistive pattern of the MR element 6 varies in accordance with the variation of the magnetic flux crossing the magnet-sensitive plane 6a. The MR element 6 outputs the voltage corresponding to the rotational angle of the magnet 4.

The output voltage of the MR element 6 is amplified and then output through the input/output terminal 9 to the outside devices (not shown), and the opening/closing condition of the throttle valve is thus detected.

As described above, the conventional magnetic sensor may be employed as, for example, a position sensor mounted on a vehicle.

Since the detecting operation of the MR element 6 is based on the variation of the magnetic flux crossing the magnet-sensitive plane 6a as disclosed above, the positional relationship of the magnet 4 and the magnet-sensitive plane 6a strictly influences the characteristics of the magnetic sensitivity of the MR element 6. According to the conventional magnetic sensor, it is necessary to use an extra accurate positioning device for positioning the MR element 6 with respect to the ceramic substrate 7 and then the terminal 6b of the MR element 6 is soldered to the wiring pattern formed on the substrate 7 and, further, the ceramic substrate 7 is accurately housed in the resin frame 1 with reference to an outer diameter of the substrate 7 to keep a positional accuracy of the magnet 4 and the magnet-sensitive plane 6a.

FIG. 2 is a partial sectional view showing another type of conventional magnetic sensor, FIG. 3 is a cross sectional view cut out along the line III—III of FIG. 2, and FIGS. 4 and 5 are plane and side views schematically showing essential portions of FIG. 2.

The conventional magnetic sensor shown in FIGS. 2-5 is provided with a resin frame 101 of the sensor, a magnet 102 rotatably mounted in the frame 101, and a ferromagnetic resistive element (hereinafter merely referred as MR element) 103. The MR element 103 may be formed of a glass substrate a magnet-sensitive plane 103a constituted by a magnetic resistive pattern of NiFe as the ferromagnetic resistive material and formed on the glass substrate, so that the MR element is molded by an insulating resin to form a rectangular solid having a terminal 103b at a side thereof for input/output signal.

The magnetic sensor is further provided with a ceramic substrate 104 performing as a circuit substrate. The MR element 103 is mounted on the substrate 104 in such a manner that the magnet-sensitive plane 103a is parallel to the plane of the substrate. In this state, the ceramic substrate 104 is accommodated and held in the resin frame 101 in such a manner that the plane of the substrate 104 is perpendicular to the magnet 102, that is, the magnet-sensitive plane 103a is perpendicular to the magnet 102. Although it is not shown in the figures, a pattern of electric wiring is formed on and various kinds of electronic devices are mounted on the ceramic substrate 104.

The operation of the conventional magnetic sensor will now be described hereinbelow.

When the magnet 102 rotates in the direction A shown in FIG. 4 in association with the opening/closing condition of a throttle valve (not shown) disposed in an intake conduit performing as an air-flow path of a vehicle, for example, the magnetic flux generated from the magnet 102 and crossing the magnet-sensitive plane 103a varies and as a result, the resistance value of the magnetic resistive pattern of the MR element 103 varies in accordance with the variation of the magnetic flux crossing the magnet-sensitive plane 103a. The MR element 103 outputs the voltage corresponding to the rotational angle of the magnet 102.

The output voltage of the MR element 103 is amplified and then output through the input/output terminal 106 to the outside devices (not shown), and the opening/closing condition of the throttle valve is thus detected.

As described above, the conventional magnetic sensor may be employed as, for example, a position sensor mounted on a vehicle.

Since the positional relationship of the magnet 102 and the magnet-sensitive plane 103a directing along the arrow B shown in FIG. 4 strictly influences the characteristics of the magnetic sensitivity of the MR element 103, according to the conventional magnetic sensor, it is necessary to use an extra accurate positioning device for positioning the MR element 103 with respect to the ceramic substrate 104 and then the terminal 103b of the MR element 103 is soldered to the wiring pattern formed on the substrate 104 and, further, the ceramic substrate 104 is accurately housed in the resin frame 101 with reference to an outer diameter of the substrate 104 to keep a positional accuracy of the magnet 102 and the magnet-sensitive plane 103a in the direction B shown in FIG. 4.

The conventional magnetic sensors as disclosed above suffer from a problem that the longitudinal length of the sensor is increased since the MR element is mounted onto the ceramic substrate so that the magnet-sensitive plane is parallel to the substrate plane and the magnet is perpendicular to the substrate plane.

Further, since the terminal is soldered to the wiring pattern formed on the ceramic substrate and then the substrate is housed in the resin frame with reference to the outer diameter of the substrate, it is required to shape the outer diameter of the substrate with high accuracy and to keep high positional accuracy of the magnet and the magnet-sensitive plane with a high accurate positioning device.

Further, since the conventional magnetic device is provided with the copper casing covering the ceramic substrate for shielding undesirable electro-magnetic wave from the outside to prevent any error operation of the circuit, the assembling steps increase and the actual manufacturing operation becomes complicated.

Furthermore, since the magnet which is previously magnetized is manually fixed to the other end of the rotating shaft by an adhesion so that the magnetic direction of the magnet is arranged in a predetermined direction according to the conventional magnetic sensor, the distance between the magnet and the MR element may vary due to the rotation of the rotating shaft. Therefore, it is difficult to obtain the coincidence of the center point of the magnet to the center point of rotation of the rotating shaft and, further, it is difficult to obtain the magnetic direction and the positional angle of the arm with high accuracy.

SUMMARY OF THE INVENTION

The present invention was made in view of the foregoing problems or difficulties accompanying the conventional magnetic sensors. Therefore, an object of the invention is to provide a magnetic sensor capable of readily achieving a high accuracy of a positional relationship between the magnet and magnet-sensitive plane.

Another object of the invention is to provide a magnetic sensor compact in size.

Still another object of the invention is to provide a magnetic sensor which can be assembled decreasing the number of steps and easily be manufactured.

Still another object of the invention is to provide a magnetic sensor capable of obtaining a high accurate coincidence in center point between the magnet and the rotating shaft, in which the magnetic direction of a magnet is directed to the predetermined direction during the fixing operation of the magnet with adhesion to improve the detection accuracy.

The above and other objects of the invention can be achieved by a provision of a magnetic sensor which, according to the present invention, includes a circuit substrate, a ferromagnetic resistive element (MR element) mounted on the substrate in such a manner that a magnet-sensitive plane of the MR element is perpendicular to the substrate plane of the substrate, and an electro-magnetic wave shielding casing for covering the MR element having a positioning portion in which the MR element is fitted to obtain an accurate position thereof.

According to another aspect of the invention, the magnetic sensor is provided with an insert part formed by molding the input/output terminal and electromagnetic shielding plate together by an insulating resin, and a frame together with the insert part by a composite electro-conductive material.

According to still another aspect of the invention, the insert mold casing for accommodating and fixing the magnet is disposed at the other end of the rotating shaft.

According to the invention, since the magnet-sensitive plane of the MR element is positioned perpendicular to the substrate plane of the circuit substrate, the circuit substrate mounting thereon the MR element can be mounted onto the frame in such a manner that the substrate plane is parallel to the magnet. Therefore, the longitudinal direction of the magnetic sensor can be reduced and hence the magnetic sensor can be assembled compact in size. Further, since the MR element is fitted in the positioning part formed on the electro-magnetic shielding casing, the positioning portion of the electro-magnetic shielding casing can be formed with high accuracy during the molding and, accordingly, the positional accuracy of the MR element can be improved in a simple manner. Furthermore, the MR element is not moved undesirably.

DESCRIPTION OF THE PREFERRED EMBODIMENTS

Preferred embodiments of the present invention will now be described in detail with reference to accompanying drawings.

Figure 6:
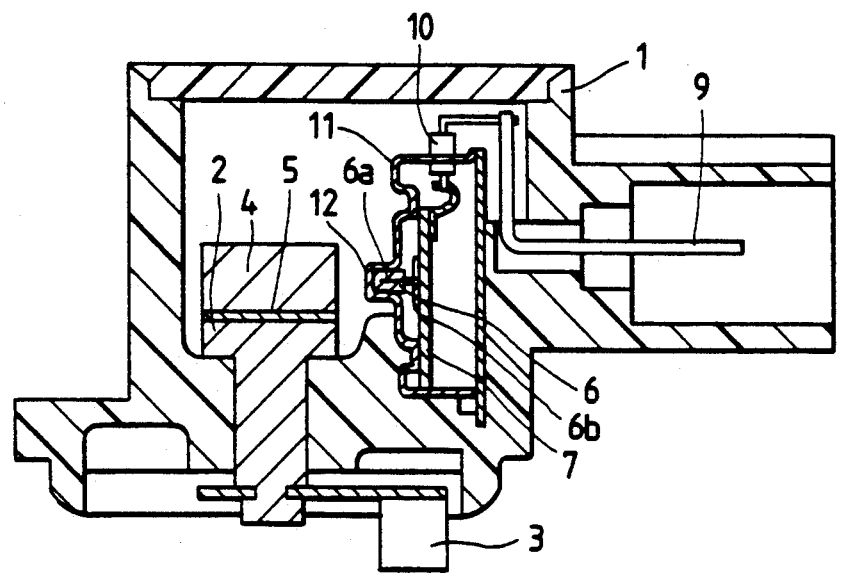
FIG. 6 is a cross sectional view showing a first embodiment of the invention.
Figure 7:
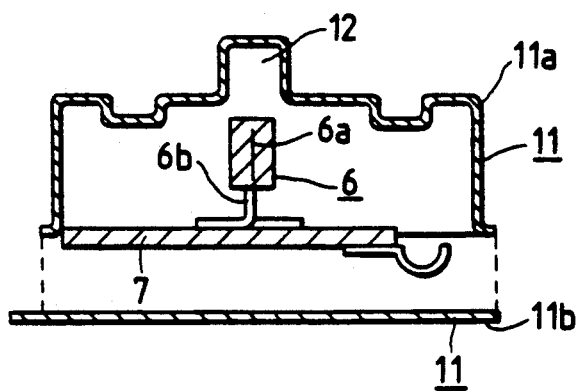
FIG. 7 is a sectional view of essential portions of FIG. 6.

FIG. 6 is a cross sectional view showing a first embodiment of the invention, and FIG. 7 is a sectional view of essential portions of FIG. 6. Like parts and components will be designated by the same reference numerals as the conventional magnetic sensor shown in FIGS. 1-5.

The magnetic sensor according to the first embodiment of the invention is provided with a copper casing 11 performing as an electro-magnetic shielding casing and constituting an upper casing 11a and a lower plate 11b, and a concave portion 12 acting as a positioning portion in which the MR element 6 is inserted.

The assembling steps of the magnetic sensor according to the first embodiment of the invention will now be described.

First, the resin frame 1 is molded. The resin frame 1 is provided with an insertion hole for inserting a rotating shaft 2 and a mounting portion for the copper casing 11. The positional relationship between the insertion hole and the copper casing mounting portion are kept with high accuracy.

Next, a terminal 6b of the MR element 6 is bent to be L-shaped and connected onto the ceramic substrate 7 so that the magnet-sensitive plane 6a is perpendicular to the substrate plane. Then the terminal 6b is soldered to the wiring pattern to accurately mount the MR element 6 onto the substrate 7 in such a manner that the magnet-sensitive plane 6a is perpendicular to the substrate plane.

In the next step, the MR element 6 is fitted in the concave portion 12 of the upper casing 11a and then the upper casing 11a and the lower plate 11b are engaged with and sealed by soldering to each other to thereby accommodate the ceramic substrate 7 on which the MR element 6 is mounted in the copper casing 11. Since the upper casing 11a is molded at the same time as the concave portion 12 is molded by a die molding, the position of the concave portion 12 can be positioned with high accuracy. Accordingly, the high accuracy of the positional relationship between the copper casing 11 and the MR element 6 can be obtained.

Next, the copper casing 11 accommodating therein the ceramic substrate 7 on which the MR element 6 is mounted is mounted on the mounting portion of the resin frame 1 perpendicularly thereto so that the magnet-sensitive plane 6a is perpendicular to the magnet 4.

Figure 1:
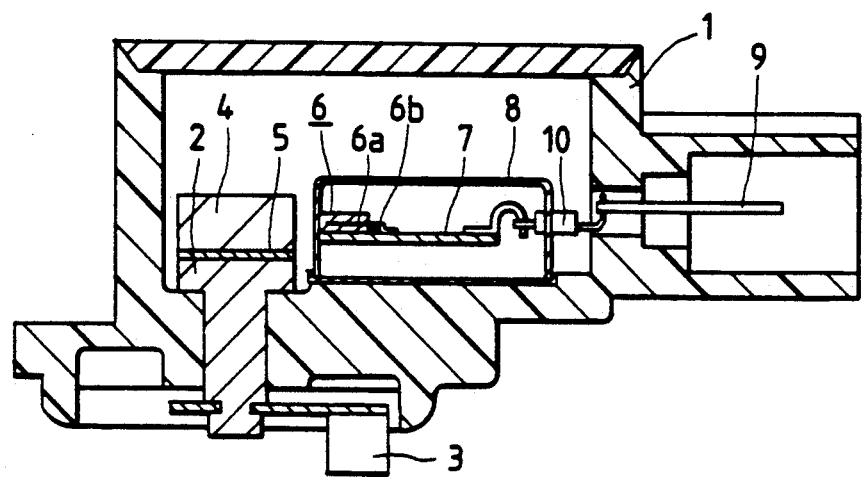
FIG. 1 is a cross-sectional view showing one conventional magnetic sensor.
Figure 2:
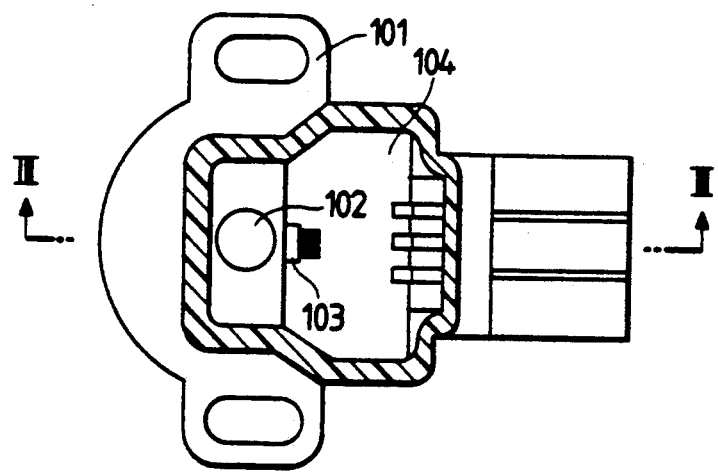
FIG. 2 is a partial sectional view showing another type of conventional magnetic sensor.
Figure 3:
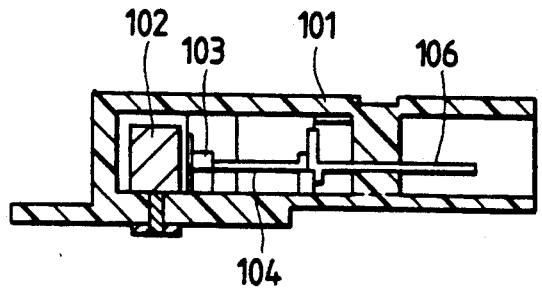
FIG. 3 is a cross sectional view cut out along the line III—III of FIG. 2.
Figure 4:
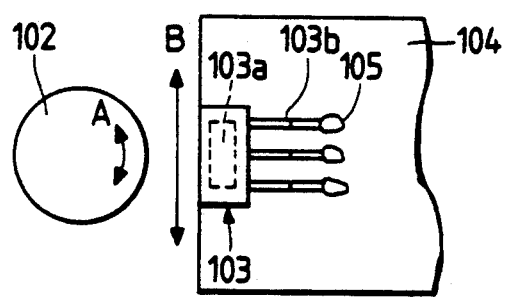
FIGS. 4 and 5 are plane and side views schematically showing essential portions of FIG. 2.
Figure 5:
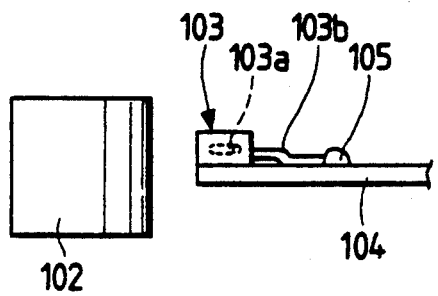

The rotating shaft 2, arm 3, magnet 4 etc. are mounted in the casing 11 in the same manner as the conventional magnetic sensor shown in FIG. 1.

The operation of the magnetic sensor according to the embodiment is the same as the conventional magnetic sensor shown in FIG. 1.

According to the first embodiment described above, since the MR element 6 is mounted on the ceramic substrate 7 in such a manner that the magnet-sensitive plane 6a is perpendicular to the substrate plane, the ceramic substrate 7 is perpendicular to the resin frame 1 and, accordingly, the longitudinal length of the magnetic sensor is largely shortened and a compact magnetic sensor can be obtained.

Further, since the concave portion 12 can readily be formed on the copper casing 11 with high accuracy, and the MR element 6 is positioned with accuracy by inserting the MR element 6 in the concave portion 12, the highly accurate positional relationship between the magnet 4 and the MR element 6 can readily be maintained without any extra accurate positioning device.

Furthermore, since the MR element 6 is fitted in the concave portion 12, the MR element is prevented from shifting or falling down due to vibration and the accurate positional relationship between the magnet 4 and the MR element 6 can be maintained long time.

Figure 8A:
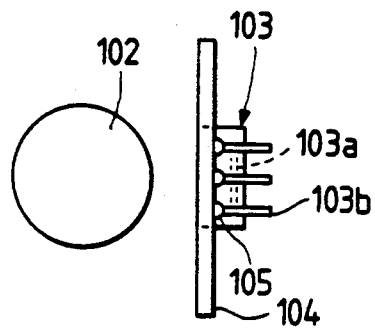
FIGS. 8A and 8B are plan view and side view, respectively, showing schematically the magnetic sensor of the second embodiment.
Figure 8B:
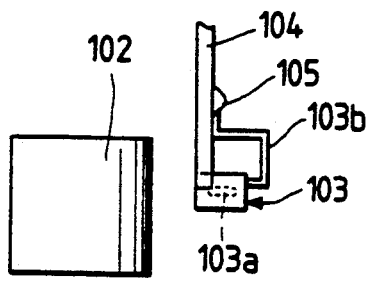
Figure 9:
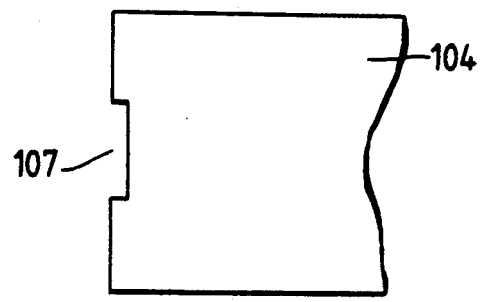
FIG. 9 is a plan view showing an essential portion of the ceramic substrate shown in FIG. 8A, 8B.

FIGS. 8A, 8B and 9 are schematic views of a magnetic sensor according to a second embodiment of the invention. Specifically, FIG. 8A and 8B are plan view and side view, respectively, showing schematically the magnetic sensor of the second embodiment. FIG. 9 is a plan view showing an essential portion of the ceramic substrate shown in FIG. 8A, 8B. In the drawings, like parts and components are designated by the same reference numerals shown in FIG. 2, and the explanation will be omitted.

According to the second embodiment, as shown in FIG. 9, the ceramic substrate 104 is provided with a concave portion 107 formed on one end surface of the substrate 104 in which the MR element 103 is fitted for accurately positioning the MR element 103. The concave portion 107 is shaped to accurately fit the MR element with reference to the outer diameter of the substrate 104 during the manufacturing process.

The process for assembling the magnetic element according to the second embodiment of the invention will now be described.

First the concave portion 107 is formed on one end of the ceramic substrate 104 with reference to the outer diameter of the substrate.

Second, the MR element 103 is fitted in the concave portion 107 in such a manner that the magnet-sensitive plane 103a is perpendicular to the substrate plane, and the terminal 103b is soldered to the wiring pattern formed on the ceramic substrate 104. Accordingly, the MR element 103 is positioned on the ceramic substrate 104 so that the magnet-sensitive plane 103a is perpendicular to the substrate plane of the substrate 104.

Third, the ceramic substrate 104 is mounted in the resin frame 101 perpendicularly thereto with reference to the outer diameter of the substrate, so that the magnet-sensitive plane 103a of the MR element 103 is perpendicular to the magnet 102 as shown in FIG. 2-5 showing the conventional magnetic sensor.

Therefore, the ceramic substrate 104 is mounted in the resin frame 101 so that the substrate plane of the ceramic substrate 104 is parallel to the magnet 102 while the MR element 103 is fitted in the concave portion 107 to thereby position the element 103 accurately with respect to the substrate 104. The magnetic sensor according to the second embodiment operates like the conventional sensor shown in FIG. 2-5.

Figure 10:
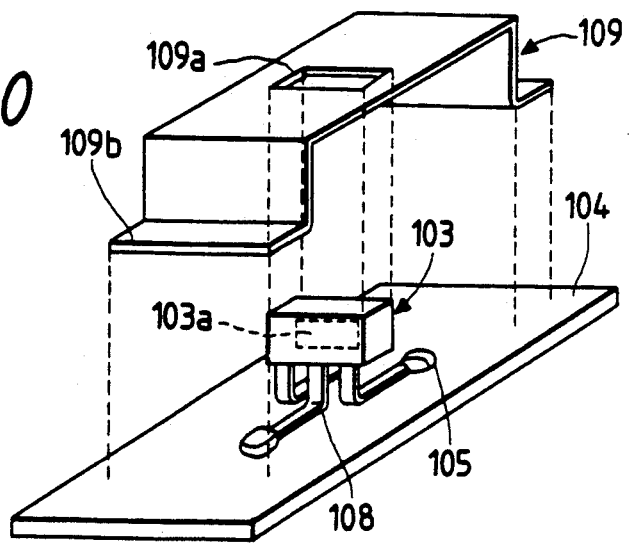
FIG. 10 is a perspective view of an essential portion of the magnetic sensor according to the third embodiment of the invention.
Figure 11A:
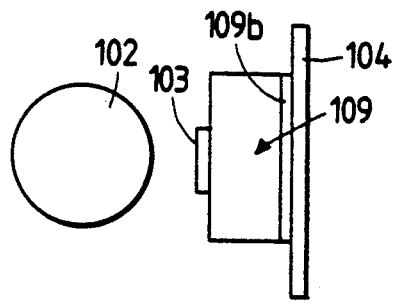
FIGS. 11A, 11B are plan view and side view, respectively, of the magnetic sensor shown in FIG. 10.
Figure 11B:
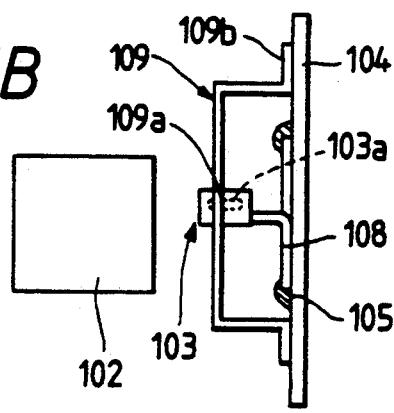

FIGS. 10 and 11A, 11B show a magnetic sensor according to a third embodiment of the invention. Specifically, FIG. 10 is a perspective view of an essential portion of the magnetic sensor according to the third embodiment of the invention and FIGS. 11A, 11B are plan view and side view, respectively, of the magnetic sensor shown in FIG. 10.

As shown in FIG. 10, an input/output terminal 108 of the MR element 103 is bent to be L-shaped. A rectangular U-shaped guide 109 is provided with an opening 109a into which the MR element 103 is inserted for preventing the MR element 103 from falling down. According to the third embodiment, an end of the L-shaped terminal 108 is soldered to the wiring pattern formed on the ceramic substrate 104, and the MR element 103 is mounted on the ceramic substrate 104 in such a manner that the magnet-sensitive plane 103a is perpendicular to the substrate plane of the substrate 104 and the guide 109 is mounted on the substrate 104 in such a manner that the MR element is inserted in the opening 109a of the guide 109, and then, the flanges 109b are secured to the substrate 104 by adhesion.

As described above, according to the third embodiment of the invention, since the MR element 103 is mounted on the ceramic substrate 104 so that the magnet-sensitive plane 103a is perpendicular to the substrate plane of the substrate 104, the ceramic substrate 104 can be mounted in the resin frame 101 in such a manner that the magnet 102 is parallel to the substrate plane. Therefore, the longitudinal length of the magnetic sensor can be shortened and a compact sensor can be achieved.

Further, since the terminal 108 of the MR element 103 is bent to be L-shaped, the MR element 103 can stably be mounted on the ceramic substrate 104, and the soldering process can readily be operated.

Furthermore, since the MR element 103 is inserted into the opening 109a of the guide 109, the MR element 103 is prevented from falling down due to vibration or the like and, therefore, the durability of the magnetic sensor is improved.

Figure 12:
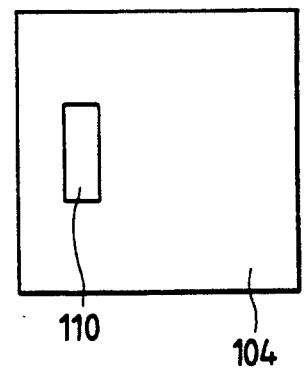
FIG. 12 is a plane view showing a circuit substrate according to the fourth embodiment of the invention.
Figure 13:
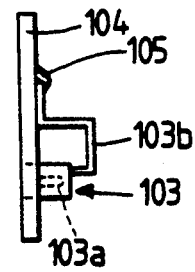
FIG. 13 is a side view of FIG. 12 with mounting the MR element.

FIG. 12 is a plane view showing a circuit substrate 104 according to the fourth embodiment of the invention and FIG. 13 is a side view of FIG. 12 with mounting the MR element 103.

The substrate 104 of the fourth embodiment is provided with an insertion hole 110 into which the MR element 103 is inserted for accurately positioning the element. The insertion hole 110 is formed at predetermined position on the ceramic substrate 104 with reference to the outer diameter of the ceramic substrate 104 to accurately inserting the MR element 103 during the manufacturing process.

In the second embodiment as described above the MR element 103 is accurately positioned on the substrate by fitting the MR element 103 into the concave portion 107 in such a manner that the magnet-sensitive plane 103a is perpendicular to the substrate plane, however, in the fourth embodiment as shown in FIG. 13 the MR element 103 is fitted into the insertion hole 110 so that the magnet-sensitive plane 103a is perpendicular to the substrate plane, and the terminal 103b is soldered to the wiring pattern formed on the substrate and then the MR element 103 is mounted on the substrate 104 which is mounted in the resin frame 101 so that the magnet-sensitive plane 103a is perpendicular to the magnet 102 with reference to the outer diameter of the substrate 104. The operation is as the same as the foregoing embodiments.

Figure 14A:
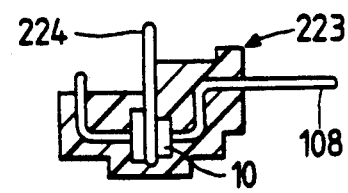
FIGS. 14A and 14B show one arrangement of the casing applied to the present invention.
Figure 14B:
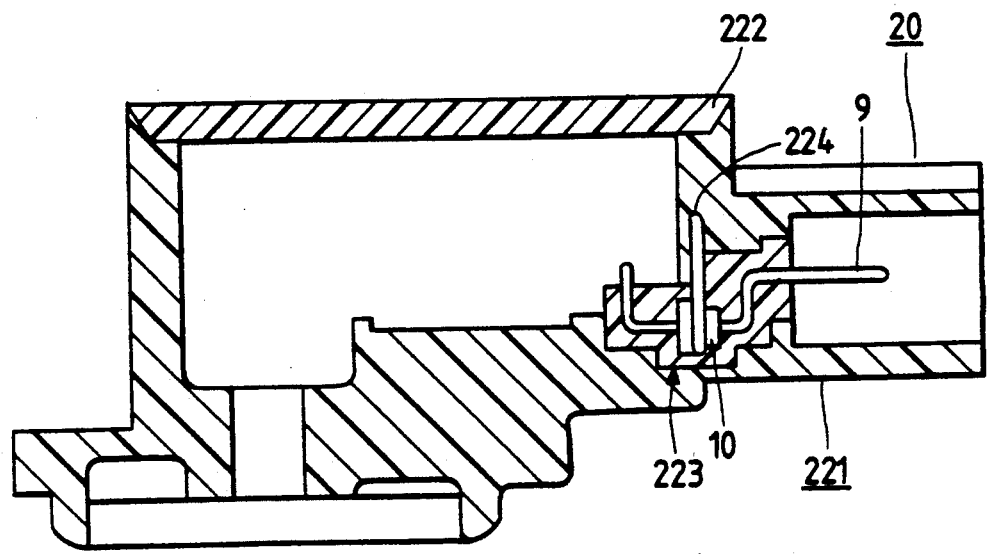

FIGS. 14A and 14B show one arrangement of the casing applied to the present invention.

The casing 20 for the magnetic sensor is provided with a frame 221 and a lid 222 and has a function for preventing the entrance of an electro-magnetic wave from outside of the casing. The frame 221 is unitarily formed with a pre-molded insert part 223. A copper plate 224 acting as an electromagnetic wave shielding plate is disposed in the insert part 223.

The process for forming the casing shown in FIGS. 14A and 14B will described hereinbelow.

First, as shown in FIG. 14A, the input/output terminal 9 connecting to the penetrating capacitor 10 and the copper plate 224 are inserted in a die, and molded with polybutylenetelephtarate resin to pre-mold the insert part 223.

Next, the insert part 223 is disposed in a die and molded with a composite electro-conductive material consisting of polybutylene-telephtarate filling therein stainless steel fibers as an electro-conductive filler to thereby form the frame 221 unitary formed with the insert part 223. The lid 222 is also molded with the composite electro-conductive material consisting of the polybutyleneterephtarate filling therein the stainless-steel fibers.

In the next step, the rotating shaft 2 is inserted in the frame 221, the arm 3 is secured to one end of the rotating shaft 2, and the magnet 102 is fixed to the other end of the rotating shaft 2 by adhesion. Further, the ceramic substrate 104 on which the MR element 103 is mounted is mounted in the frame 221 and then the input/output terminal 108 is connected to the ceramic substrate 104. Afterwards, the lid 222 is attached to the frame 221 to close the opening part of the frame 221, and the lid 222 and the frame 221 are heat-sealed to be one unit, thereby to obtain a magnetic sensor having the casing 20 accommodating therein the magnet 102, MR element 103.

According to the above arrangement, since the frame 221 and the lid 222 constituting the casing 220 are formed of the composite electro-magnetic material by molding and the copper plate 224 is disposed in the insert part 223 formed of an insulating resin, any undesired electro-magnetic wave is prevented from entering into the casing 20 from the outside and, accordingly, errors of the circuit elements mounted on the ceramic substrate are prevented. Therefore, this arrangement has an advantage that no copper casing for shielding is required since the casing 20 itself has a function for shielding the undesirable electro-magnetic wave. As a result, the number of parts can be reduced and the assembling steps are also reduced, therefore, the magnetic sensor can readily be assembled.

In one example, the composite electro-conductive material is constituted by polybutylenetelephtarate resin filling therein stainless steel fibers having a diameter of 10 $\mu$m by 1 vol % for achieving a desired electro-magnetic wave shielding function. This may be caused by forming paths by contacting electro-magnetic filler materials. In this regard, if the length of the fiber of the filler is long or diameter of which is larger, the large effect can be obtained even the filling rate is relatively low.

Although the stainless steel fibers are employed as the electro-magnetic filler material in the above discussion, the invention is not limited thereto or thereby. That is, for example, carbon fibers, metal fibers, metal particles or the like may be employed instead of the stainless steel fibers.

Figure 15:
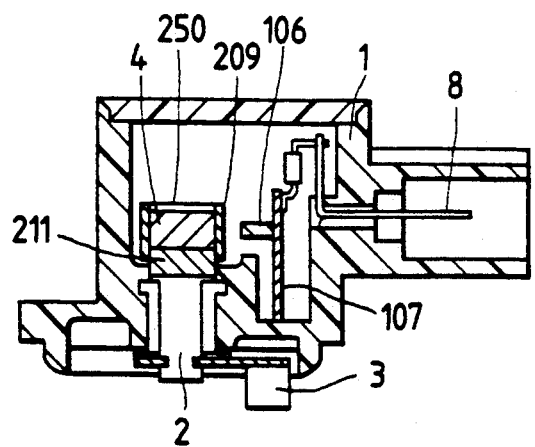
FIG. 15 show one arrangement of fixing the magnet.

FIG. 15 show one arrangement of fixing the magnet. In the drawing, like parts and components are designated by the same reference numerals as shown in FIG. 1 of the conventional magnetic sensor and description will be omitted.

In this arrangement, a mold casing 209 having a cylindrical side wall is insert molded on a knurled end 211 of the rotating shaft 2. An inner diameter of the side wall of the mold casing 209 is set larger than an outer diameter of the cylindrical magnet 4 which is rotatably housed in the mold casing 209. The magnet 4 is secured to the mold casing 209 by adhesion 250.

In the arrangement constructed as shown in FIG. 15, since the mold casing 209 is insert molded on the knurled end 211 of the rotating shaft 2, the center point of the rotating shaft 2 can easily be arranged coincident with the center point of the mold casing 209 and, accordingly, the center point of the magnet 4 coincides with that of the rotating shaft 2 only by mounting the magnet 4 into the mold casing 209. Hence, the manual operation required by the conventional sensor becomes unnecessary. As a result, the operatability and manufacturability are greatly improved.

Further, since the rotating shaft 2 is provided with the knurled end 211 and the mold resin is filled in the grooves on the knurled end 211, the fixation strength of the mold casing 209 with the rotating shaft 2 is also improved.

The process for securing the magnet will be described with reference to FIGS. 16A to 16D.

First, an end of the rotating shaft 2 is subjected with a knurled operation to form the knurled end 211, and the mold casing 209 having a cylindrical side wall is insert molded on the knurled end 211 of the rotating shaft 2.

Figure 16A:
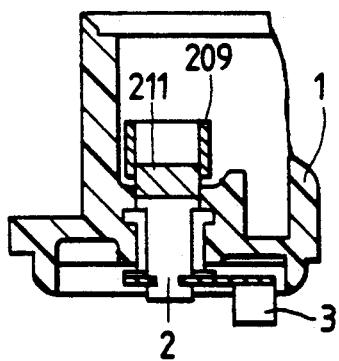
FIGS. 16A to 16D show the process for securing the magnet according to the invention shown in FIG. 15.

Next, as shown in FIG. 16A, the rotating shaft 2 on which the molding case 209 having the cylindrical side wall is formed is rotatably mounted in the resin frame 1, and the arm 3 is fixed to one end of the rotating shaft 2.

Figure 16B:
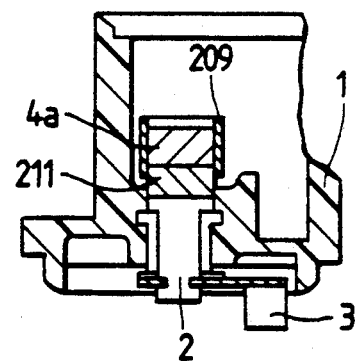

Afterwards, as shown in FIG. 16B, the arm 3 is secured to have a predetermined angle, and a cylindrical and not magnetized magnetic material 4a having an outer diameter smaller than an inner diameter of the mold casing 209 is mounted in the mold casing 209. In this state, the magnetic material 4a is rotatably accommodated in the mold casing 209.

Figure 16C:
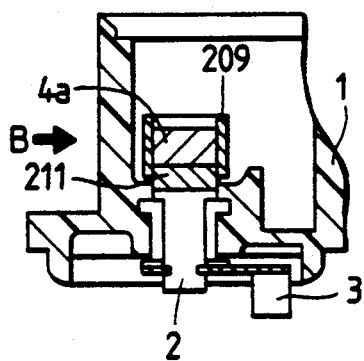

In the next step, as shown in FIG. 16C, a magnetic field B for magnetization is applied to the magnetic material 4a along a predetermined direction. By the application of the magnetic field B, the magnetic material 4a accommodated in the mold casing 209 itself rotates in the casing 209 to be magnetized with the magnetic direction coincident with the magnetic field B in the most effective way.

Figure 16D:
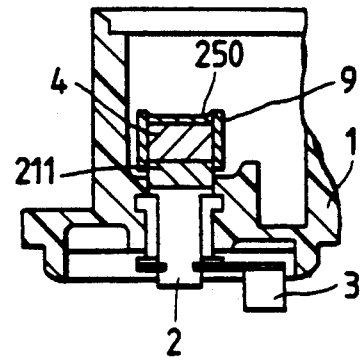

Afterwards, as shown in FIG. 16D, the adhesion 250 is supplied to adhere the magnet 4 into the mold casing 209.

As described above, according to the arrangement of the magnet fixing process, since the mold casing 209 is insert molded on the knurled end 211 of the rotating shaft 2, the center point of the rotating shaft 2 can easily be arranged coincident with the center point of the mold casing 209 and, accordingly, the center point of the magnet 4 coincides with that of the rotating shaft 2. As a result, the detecting accuracy of the magnetic sensor is improved because the distance of the magnet 4 and the MR element 106 does not vary due to the rotation of the rotating shaft 2. Further, since the rotating shaft 2 is provided with the knurled end 211 and the mold resin is filled in the grooves on the knurled end 211, the fixation strength of the mold casing 209 with the rotating shaft 2 is also improved and, accordingly, the durability of the sensor is greatly improved.

Further, the unmagnetized magnetic material 4a rotatably accommodated in the mold casing 209 is supplied with the magnetic field B along the predetermined direction while the arm 3 is fixed to have the predetermined angle, and the magnetic material 4a rotates to be magnetized so that the magnetic direction of the magnet coincides with the direction of the magnetic field B in the most effective way, and then the magnet 4 is adhered into the mold casing 209. Therefore, the positional direction between the magnetic direction of the magnet 4 and the arm 3 can readily be achieved with high accuracy. Further, the positional relationship between the arm 3 connected to the rotation of the object to be detected and the direction of the magnet 4 can be maintained with high accuracy. Accordingly, the sensitivity of the magnetic sensor improves largely.

Furthermore, since the mold casing 209 is insert molded on the end of the rotating shaft 2, the magnet 4 can rotatably be inserted into the mold casing 209 and adhered thereinto by the adhesion 250. Hence, the mounting process of the magnet 4 can be operated easily.

In the above arrangement the unmagnetized magnetic material 4a is mounted in the mold casing 209 and then the magnetic material 4a is magnetized and secured. However, the magnet which may previously be magnetized before mounted into the casing.

The operation of the magnetic sensor in the foregoing arrangements are the same as that of the conventional magnetic sensor.

Figure 17:
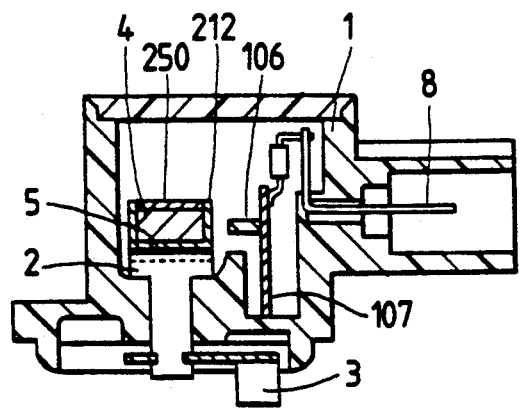
FIG. 17 show another arrangement of fixing the magnet.

FIG. 17 is a cross-sectional view of the magnetic sensor according to another arrangement. In this arrangement, a mold casing 212 has a bottom surface and cylindrical side wall and secured on the other end of the rotating shaft. An inner diameter of the mold casing 212 is formed larger than the outer diameter of the cylindrical magnet 4. The magnet 4 is rotatably mounted into the mold casing 212. This arrangement is advantageous in that since the mold casing 212 is disposed on the rotating shaft 2, the magnet 4 can readily be inserted into and adhered to the mold casing 212 with the adhesion 250 so that the operatability during assembly is improved.

The process for securing the magnet according to the second arrangement will be described with reference to FIGS. 18A to 18D.

Figure 18A:
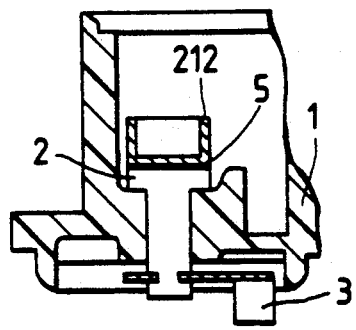
FIGS. 18A to 18D show the process for securing the magnet according to the invention shown in FIG. 17.

First, as shown in FIG. 18A, the rotating shaft 2 is rotatably mounted in the resin frame 1, and the arm 3 is fixed to one end of the rotating shaft 2. Then the mold casing 212 is secured on the other end of the rotating shaft 2 by the adhesion 5.

Figure 18B:
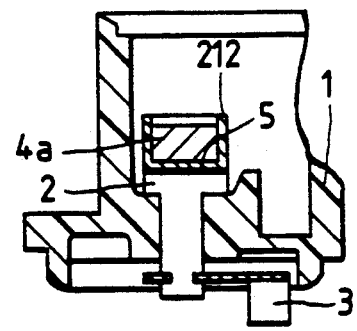

Afterwards, as shown in FIG. 18B, the arm 3 is secured to have a predetermined angle, and a cylindrical and not magnetized magnetic material 4a having an outer diameter smaller than an inner diameter of the mold casing 212 is mounted in the mold casing 212. In this state, the magnetic material 4a is rotatably accommodated in the mold casing 212.

Figure 18C:
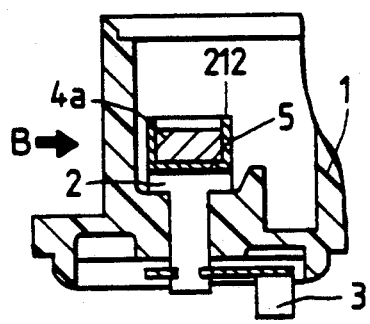

In the next step, as shown in FIG. 18C, a magnetic field B for magnetization is applied to the magnetic material 4a along a predetermined direction. By the application of the magnetic field B, the magnetic material 4a accommodated in the mold casing 212 itself rotates in the casing 212 to be magnetized with the magnetic direction coincident with the magnetic field B in the most effective way.

Figure 18D:
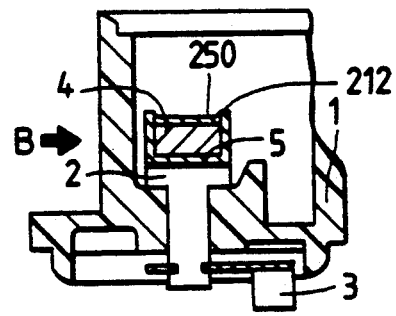

Afterwards, as shown in FIG. 18D, the adhesion 250 is supplied to adhere the magnet 4 into the mold casing 212.

As described above, according to the second arrangement of the magnet fixing process, since the unmagnetized magnetic material 4a rotatably accommodated in the mold casing 212 is supplied with the magnetic field B along the predetermined direction while the arm 3 is fixed to have the predetermined angle, and the magnetic material 4a rotates to be magnetized so that the magnetic direction of the magnet coincides with the direction of the magnetic field B in the most effective way, and then the magnet 4 is adhered into the mold casing 212. Therefore, the positional direction between the magnetic direction of the magnet 4 and the arm 3 can readily be achieved with high accuracy. Further, the positional relationship between the arm 3 interconnected to the rotation of the object to be detected and the magnetic direction of the magnet 4 can be maintained with high accuracy. Accordingly, the sensitivity of the magnetic sensor improves largely.

Furthermore, since the mold casing 212 is secured by adhesion on the end of the rotating shaft 2, the magnet 4 can rotatably be inserted into the mold casing 212 and adhered thereinto with the adhesion 250. Hence, the mounting process of the magnet 4 can be operated easily.

The operation of the magnetic sensor in the foregoing arrangements are the same as that of the conventional magnetic sensor.

As described above, according to the present invention, since the MR element is mounted on the ceramic substrate in such a manner that the magnet-sensitive plane 6a is perpendicular to the substrate plane, the ceramic substrate is perpendicular to the resin frame 1 and, accordingly, the longitudinal length of the magnetic sensor is largely shortened and a compact magnetic sensor can be obtained.

Further, since the concave portion illustrated in FIGS. 6 and 7 can readily be formed on the copper casing with high accuracy, and the MR element is positioned with accuracy by inserting the MR element in the concave portion, the highly accurate positional relationship between the magnet and the MR element can readily be maintained without any extra accurate positioning device.

Furthermore, since the MR element is mounted on the ceramic substrate so that the magnet-sensitive plane is perpendicular to the substrate plane of the substrate, the ceramic substrate can be mounted in the resin frame in such a manner that the magnet is parallel to the substrate plane. Therefore, the longitudinal length of the magnetic sensor can be shortened and a compact sensor can be achieved.

Moreover, since the terminal, of the MR element is bent to be L-shaped as illustrated in FIG. 7, for example, the MR element can stably be mounted on the ceramic substrate, and the soldering process can readily be operated.

Still further, since the MR element is inserted into the opening of the guide in the embodiment illustrated in FIG. 10, the MR element is prevented from falling down due to or the like and, therefore, the durability of the magnetic sensor is improved.

Still more, since the frame and the lid constituting the casing in the embodiment illustrated in FIG. 14B are formed of the composite electro-magnetic material by molding and the copper plate is disposed in the insert part formed of an insulating resin, any undesired electro-magnetic wave is prevented from entering into the casing from the outside and, accordingly, the circuit elements mounted on the ceramic substrate is prevented from occurring any error operation. Therefore, this arrangement has an advantage that no copper casing for shielding is required since the casing itself has a function for shielding the undesirable electro-magnetic wave. As a result, the number of parts can be reduced and the assembling steps are also reduced, therefore, the magnetic sensor can readily be assembled.

Moreover, in the embodiment illustrated in FIG. 18B, the unmagnetized magnetic material rotatably accommodated in the mold casing is supplied with the magnetic field along the predetermined direction while the arm is fixed to have the predetermined angle, and the magnetic material rotates to be magnetized so that the magnetic direction of the magnet coincides with the direction of the magnetic field in the most effective way, and then the magnet is adhered into the mold casing. Therefore, the positional direction between the magnetic direction of the magnet and the arm can readily be achieved with high accuracy. Further, the positional relationship between the arm interconnected to the rotation of the object to be detected and the magnetic direction of the magnet can be maintained with high accuracy. Accordingly, the sensitivity of the magnetic sensor improves largely.

Furthermore, since the mold casing is formed on the end of the rotating shaft, the magnet can be inserted into the mold casing and adhered secured thereto. Hence, the mounting process of the magnet can be operated easily.

Still further, the detecting accuracy of the magnetic sensor is improved because the distance of the magnet and the MR element does not vary due to the rotation of the rotating shaft. Further, since the rotating shaft is provided with the knurled end and the mold resin is filled in the grooves on the knurled end as illustrated in the embodiment of FIG. 15, the fixation strength of the mold casing with the rotating shaft is also improved and, accordingly, the durability of the sensor is greatly improved.

What is claimed is:
1. A magnetic sensor comprising:
  a frame forming a housing for elements of said magnetic sensor;
  a magnet accommodated in said frame, said magnet being mounted on one end of a rotating shaft rotatably disposed in said frame;
  a ferromagnetic resistive (MR) means for detecting variation of the magnetic flux associated with the rotation of said magnet, said ferromagnetic resistive means comprising:
    a ceramic substrate having a substrate plane; and
    a MR element connected to said ceramic substrate by leads having a magnet-sensitive plane arranged perpendicular to a plane of said magnet and to said substrate plane, and
  means for positioning said MR element within said magnetic sensor with respect to said magnet,
  wherein said ferromagnetic resistive means comprises a shielding case housing therein said MR element and said substrate, said shielding case comprising an upper casing and a lower casing engaged with said upper casing, and wherein said positioning means comprises a concave portion formed on said upper casing of said shielding case, said concave portion receiving said MR element.

2. The magnetic sensor of claim 1, wherein said shielding case is formed of copper.

3. The magnetic sensor of claim 1, wherein said frame is formed of a composite electromagnetic material.

4. The magnetic sensor of claim 1, wherein said magnet is inserted into and secured by adhesion to a mold casing formed on said one end of said rotating shaft.

5. The magnetic sensor of claim 4, wherein said mold casing is secured on the opposite end of said rotating shaft.

6. The magnetic sensor of claim 5, wherein said end of said rotating shaft on which said mold casing is secured comprises a knurled surface.

7. A magnetic sensor comprising:
a frame forming a housing for elements of said magnetic sensor;
a magnet accommodated in said frame, said magnet being mounted on one end of a rotating shaft rotatably disposed in said frame;
a ferromagnetic resistive (MR) means for detecting variation of the magnetic flux associated with the rotation of said magnet, said ferromagnetic resistive means comprising:
a ceramic substrate having a substrate plane; and
a MR element connected to said ceramic substrate by leads having a magnet-sensitive plane arranged perpendicular to a plane of said magnet and to said substrate plane, and
means for positioning said MR element within said magnetic sensor with respect to said magnet,
wherein said positioning means comprises a substantially U-shaped guide member secured onto said substrate, said guide member having an opening into which said MR element is inserted.

8. A magnetic sensor comprising:
a frame forming a housing for elements of said magnetic sensor;
a magnet accommodated in said frame, said magnet being mounted on one end of a rotating shaft rotatably disposed in said frame;
a ferromagnetic resistive (MR) means for detecting variation of the magnetic flux associated with the rotation of said magnet, said ferromagnetic resistive means comprising:
a ceramic substrate having a substrate plane; and
a MR element connected to said ceramic substrate by leads having a magnet-sensitive plane arranged perpendicular to a plane of said magnet and to said substrate plane, and
means for positioning said MR element within said magnetic sensor with respect to said magnet,
wherein said frame is formed of a composite electromagnetic material,
said magnetic sensor further comprising a copper plate insert-molded in said frame to prevent electromagnetic waves from entering said frame.

9. The magnetic sensor of claim 8, wherein said composite electromagnetic material comprises polybutylenetelephtarate resin wherein an electromagnetic material is filled.

10. The magnetic sensor of claim 9, wherein said electromagnetic material comprises stainless steel fibers.

11. The magnetic sensor of claim 10, wherein said stainless steel fibers having a diameter of 10 $\mu$m by 1 vol %.

12. The magnetic sensor of claim 9, wherein said electromagnetic material comprises carbon fibers.

13. The magnetic sensor of claim 9, wherein said electromagnetic material comprises metal fibers.

14. The magnetic sensor of claim 9, wherein said electromagnetic material comprises metal particles.

* * * * *